United States Patent
Lee

(10) Patent No.: US 11,462,900 B2
(45) Date of Patent: Oct. 4, 2022

(54) BUS DRIVING DEVICE

(71) Applicant: AMAZING MICROELECTRONIC CORP., New Taipei (TW)

(72) Inventor: Che-Cheng Lee, Zhubei (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 186 days.

(21) Appl. No.: 17/114,188

(22) Filed: Dec. 7, 2020

(65) Prior Publication Data

US 2022/0181868 A1  Jun. 9, 2022

(51) Int. Cl.
*H03K 17/687* (2006.01)
*H02H 3/20* (2006.01)
*H04L 12/40* (2006.01)

(52) U.S. Cl.
CPC ........... *H02H 3/20* (2013.01); *H03K 17/6872* (2013.01); *H04L 12/40013* (2013.01)

(58) Field of Classification Search
CPC ................. H03K 17/08; H03K 17/081; H03K 17/08104; H03K 17/16; H03K 17/161; H03K 17/162; H03K 17/164; H03K 17/687; H03K 17/6871; H03K 17/6872; H03K 17/6874; H03K 19/00346; H03K 19/00361; H02H 3/20; H04L 12/40; H04L 12/40013
See application file for complete search history.

(56) References Cited

U.S. PATENT DOCUMENTS

| 7,051,130 | B1 | 5/2006 | Horowuz et al. |
| 9,501,443 | B2 | 11/2016 | Pardoen |
| 9,685,936 | B2 * | 6/2017 | Chang ................. G06F 13/4072 |
| 10,892,759 | B1 * | 1/2021 | Lee .......................... H04L 12/40 |
| 2010/0085098 | A1 | 4/2010 | Ferguson |

FOREIGN PATENT DOCUMENTS

CN  111726111 A  9/2020

* cited by examiner

*Primary Examiner* — Long Nguyen
(74) *Attorney, Agent, or Firm* — Birch, Stewart, Kolasch & Birch, LLP

(57) ABSTRACT

A bus driving device includes at least three high-side output drivers and at least three low-side output drivers. A part of the high-side output drivers and a part of the low-side output drivers are alternately coupled in series, and the remains of the high-side output drivers and the low-side output drivers are alternately coupled in series. The part of the high-side output drivers and the part of the low-side output drivers receive an input digital signal and sequentially drive a first supply bus and a second supply bus based on the input digital signal, and the remains of the high-side output drivers and the low-side output drivers receive the inverted input digital signal and sequentially drive the first supply bus and the second supply bus based on the inverted input digital signal.

10 Claims, 9 Drawing Sheets

BUS DRIVING DEVICE

BACKGROUND OF THE INVENTION

Field of the Invention

The present invention relates to a driving device, particularly to a bus driving device.

Description of the Related Art

The controller area network (CAN) issued by International Standard Organization (ISO) (ISO-11898) is a communication system developed for European automobiles to transmit information in very harsh environments, integrating several in-vehicle controllers or computers to a network for sharing responsibilities and information, whereby to execute the demanded functions. The CAN bus is able to transmit information stably in harsh or instable electrical environments and usually applied to the control systems of various types of vehicles. The CAN bus adopts the two-wire differential technology and uses differential signals to transmit information. The common-mode signals on the two wires are maintained at a DC voltage, whereby only a very small amount of electromagnetic waves is emitted from the transmission lines, and whereby the CAN bus can transmit signals persistently while external common-mode signals interferes with the differential bus.

In a vehicular environment, great ground voltage shift exists between the ground terminals of different communication nodes. The maximum level of the ground shift voltage will be further increased by batteries with higher output voltage be applied in future vehicles. For example, the output voltage level of the batteries applied in traditional gasoline vehicles is 12V. However, the output voltage level of the batteries applied in modern electric vehicle has been increased to 48V for longer battery life currently. Therefore, the common-mode input voltage range of the CAN transceiver integration circuit must be improved continuously so as to normally receive information in the case that great ground voltage shift exists between the ground terminals of different communication nodes. Besides, in order to avoid electromagnetic emission (EME) from the communication network to interfere other functions of the vehicle, the common-mode signal of the CAN bus must be maintained at a fixed DC voltage and avoid any unnecessary high-frequency fluctuation on the common-mode signals during the circuit operation.

The transmitter of high-speed controller area network (HS-CAN) must have a high data rate and low electromagnetic interference (EMI) performance. As illustrated in FIG. 1 and FIG. 2, a transmitter 1 includes a high-side output driver 10 and a low-side output driver 12. The high-side output driver 10 and the low-side output driver 12 respectively receive a digital voltage TXD and the inverted digital voltage TXD. When the digital voltage TXD is a high-level voltage, the transmitter 1 is in a recessive state. When the digital voltage TXD is a low-level voltage, the transmitter 1 is in a dominant state. The high-side output driver 10 and the low-side output driver 12, respectively connected to a first CAN bus and a second CAN bus, respectively transmit a first bus voltage CANH and a second bus voltage CANL to the first CAN bus and the second CAN bus. The first bus voltage CANH plus the second bus voltage CANL equals to a common-mode voltage. However, when the transmitter 1 changes from the recessive state to the dominant state or changes from the dominant state to the recessive state, the high-side output driver 10 and the low-side output driver 12 do not simultaneously be turned on or turned off, and the bus signal slopes generated by high-side output driver 10 and low-side output driver 12 may be different. As a result, the noise of the common-mode voltage is high, such that the EMI performance will be degraded.

To overcome the abovementioned problems, the present invention provides a bus driving device.

SUMMARY OF THE INVENTION

The present invention provides a bus driving device, which perfectly generates symmetric bus signals at a high data rate, such as 5 Mbps.

In an embodiment of the present invention, a bus driving device includes at least three high-side output drivers coupled to a first supply bus and at least three low-side output drivers coupled to a second supply bus. A part of the high-side output drivers and a part of the low-side output drivers are alternately coupled in series, the remains of the high-side output drivers and the low-side output drivers are alternately coupled in series, the number of the part of the high-side output drivers and the part of the low-side output drivers is equal to the number of the remains of the high-side output drivers and the low-side output drivers, the part of the high-side output drivers and the part of the low-side output drivers are configured to receive an input digital signal and sequentially drive the first supply bus and the second supply bus based on the input digital signal, and the remains of the high-side output drivers and the low-side output drivers are configured to receive the inverted input digital signal and sequentially drive the first supply bus and the second supply bus based on the inverted input digital signal.

In an embodiment of the present invention, each of the high-side output drivers includes a first current source, a first electrical switch, a first current mirror, and a first current sensing circuit. The first current source is coupled to a low-voltage terminal and configured to generate a first constant current. The first electrical switch is coupled to the first current source, wherein the first electrical switch is configured to receive the input digital signal or coupled to one of the low-side output drivers, and the input digital signal or one of the low-side output drivers is configured to turn on or turn off the first electrical switch. The first current mirror is coupled to the first supply bus, a high-voltage terminal and the first electrical switch, wherein the first current mirror drives the first supply bus based on the first constant current when the first electrical switch is turned on, and the first current mirror stops driving the first supply bus when the first electrical switch is turned off. The first current sensing circuit is coupled to a first control terminal of the first current mirror, the high-voltage terminal, the low-voltage terminal, and one of the low-side output drivers, wherein the first current sensing circuit triggers on one of the low-side output drivers when the first electrical switch is turned on, and the first current sensing circuit triggers off one of the low-side output drivers when the first electrical switch is turned off.

In an embodiment of the present invention, the first current mirror includes a first P-channel metal oxide semiconductor field effect transistor (PMOSFET) and a second P-channel metal oxide semiconductor field effect transistor (PMOSFET). The source of the first PMOSFET is coupled to the high-voltage terminal. The drain of the first PMOSFET is coupled to the first electrical switch. The source of the second PMOSFET is coupled to the high-voltage terminal. The gate of the second PMOSFET is coupled to the first current sensing circuit, and the gate and the drain of the first PMOSFET. The drain of the second PMOSFET is coupled to the first supply bus. The gate of the first PMOSFET is used as the first control terminal The first PMOSFET and the second PMOSFET drive the first supply bus based on the first constant current when the first electrical switch is turned on. The first PMOSFET and the second PMOSFET stop driving the first supply bus when the first electrical switch is turned off.

In an embodiment of the present invention, the first current sensing circuit includes a third P-channel metal oxide semiconductor field effect transistor (PMOSFET), a first inverter, and a second inverter. The gate of the third PMOSFET is coupled to the first control terminal The source of the third PMOSFET is coupled to the high-voltage terminal The drain of the third PMOSFET is coupled to the low-voltage terminal through a first resistor. The first inverter coupled to the high-voltage terminal, the low-voltage terminal, the first resistor, and the drain of the third PMOSFET. The second inverter is coupled to the high-voltage terminal, the low-voltage terminal, the first inverter, and one of the low-side output drivers, wherein the third PMOSFET, the first resistor, the first inverter, and the second inverter trigger on one of the low-side output drivers when the first electrical switch is turned on, and the third PMOSFET, the first resistor, the first inverter, and the second inverter trigger off one of the low-side output drivers when the first electrical switch is turned off.

In an embodiment of the present invention, each of the low-side output drivers includes a second current source, a second electrical switch, a second current mirror, and a second current sensing circuit. The second current source is coupled to the high-voltage terminal and configured to generate a second constant current. The second electrical switch is coupled to the second current source, wherein the second electrical switch is configured to receive the inverted input digital signal or coupled to one of the high-side output drivers, and the inverted input digital signal or one of the high-side output drivers is configured to turn on or turn off the second electrical switch. The second current mirror is coupled to the second supply bus, the low-voltage terminal, and the second electrical switch, wherein the second current mirror drives the second supply bus based on the second constant current when the second electrical switch is turned on, and the second current mirror stops driving the second supply bus when the second electrical switch is turned off. The second current sensing circuit is coupled to a second control terminal of the second current mirror, the high-voltage terminal, the low-voltage terminal, and one of the high-side output drivers, wherein the second current sensing circuit triggers on one of the high-side output drivers when the second electrical switch is turned on, and the second current sensing circuit triggers off one of the high-side output drivers when the second electrical switch is turned off.

In an embodiment of the present invention, the second current mirror includes a first N-channel metal oxide semiconductor field effect transistor (NMOSFET) and a second N-channel metal oxide semiconductor field effect transistor (NMOSFET). The source of the first NMOSFET is coupled to the low-voltage terminal The drain of the first NMOSFET is coupled to the second electrical switch. The source of the second NMOSFET is coupled to the low-voltage terminal The gate of the second NMOSFET is coupled to the second current sensing circuit, and the gate and the drain of the first NMOSFET. The drain of the second NMOSFET is coupled to the second supply bus. The gate of the first NMOSFET is used as the second control terminal, the first NMOSFET and the second NMOSFET drive the second supply bus based on the second constant current when the second electrical switch is turned on, and the first NMOSFET and the second NMOSFET stop driving the second supply bus when the second electrical switch is turned off.

In an embodiment of the present invention, the second current sensing circuit includes a third N-channel metal oxide semiconductor field effect transistor (NMOSFET), a third inverter, and a fourth inverter. The gate of the third NMOSFET is coupled to the second control terminal. The source of the third NMOSFET is coupled to the low-voltage terminal The drain of the third NMOSFET is coupled to the high-voltage terminal through a second resistor. The third inverter is coupled to the high-voltage terminal, the low-voltage terminal, the second resistor, and the drain of the third NMOSFET. The fourth inverter is coupled to the high-voltage terminal, the low-voltage terminal, the third inverter, and one of the high-side output drivers, wherein the third NMOSFET, the second resistor, the third inverter, and the fourth inverter trigger on one of the high-side output drivers when the second electrical switch is turned on, and the third NMOSFET, the second resistor, the third inverter, and the fourth inverter trigger off one of the high-side output drivers when the second electrical switch is turned off.

In an embodiment of the present invention, the bus driving device further includes a first high-voltage protection circuit coupled between the first supply bus and a first output and configured to prevent an ultra-negative voltage at the first supply bus from passing to the first output; and a second high-voltage protection circuit coupled between the second supply bus and a second output and configured to prevent an ultra-positive voltage at the second supply bus from passing to the second output.

In an embodiment of the present invention, the first high-voltage protection circuit comprises a P-channel metal oxide semiconductor field effect transistor (PMOSFET) and a diode connected in series, and the second high-voltage protection circuit comprises an N-channel metal oxide semiconductor field effect transistor (NMOSFET) and a diode connected in series.

In an embodiment of the present invention, the number of the high-side output drivers is 3×N, the number of the low-side output drivers is 3×M, and N and M are positive integers.

To sum up, the bus driving device includes high-side output drivers coupled to a first supply bus and low-side output drivers coupled to a second supply bus. The high-side output drivers and the low-side output drivers are alternately coupled in series. As a result, the bus driving device can drive the first supply bus and the second supply bus at a constant slew rate to make a low common-mode noise.

Below, the embodiments are described in detail in cooperation with the drawings to make easily understood the technical contents, characteristics and accomplishments of the present invention.

DETAILED DESCRIPTION OF THE INVENTION

Figure 1:
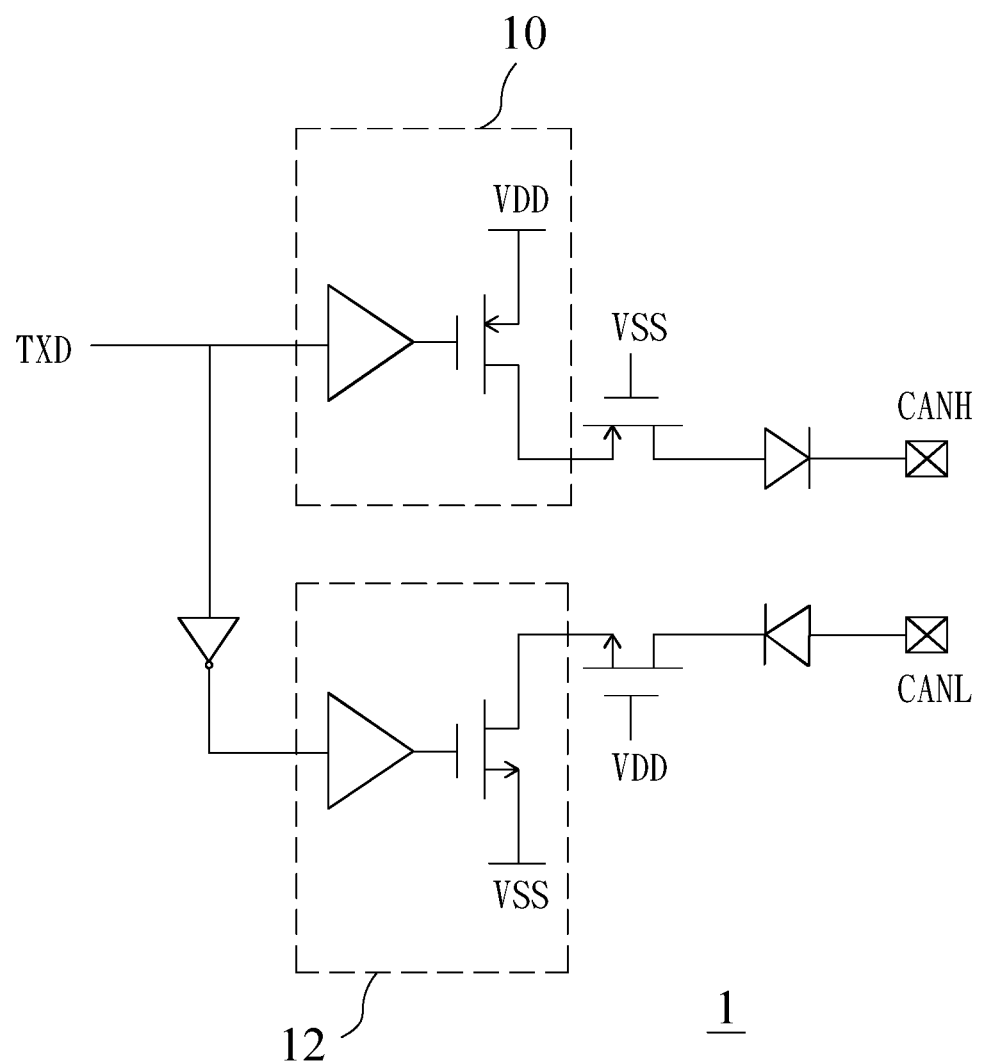
FIG. 1 is a diagram schematically illustrating a conventional transmitter.
Figure 2:
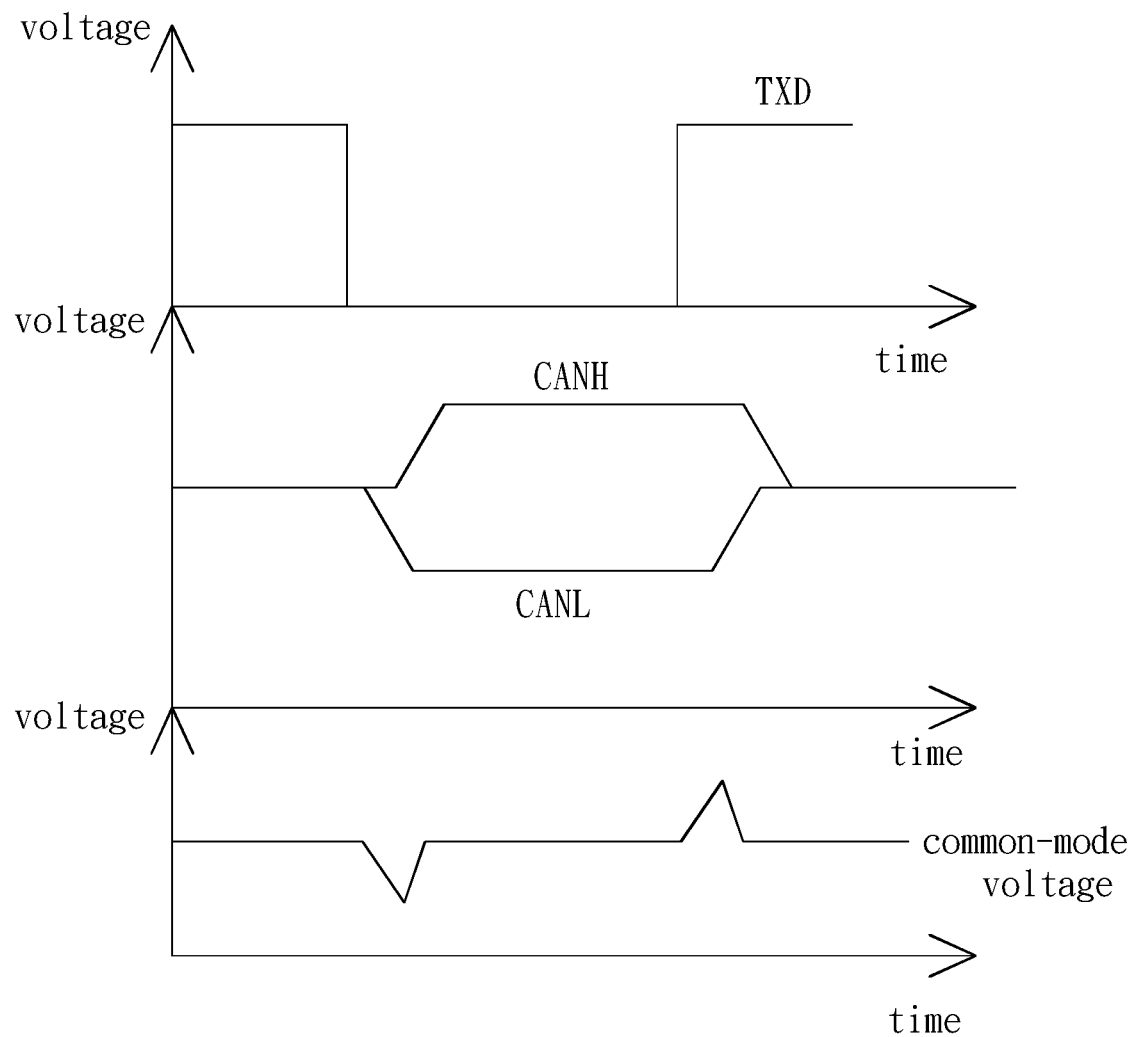
FIG. 2 is a diagram schematically illustrating the conventional waveforms of a digital voltage, a first bus voltage, a second bus voltage, and a common-mode voltage.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In the following description, a bus driving device will be provided. The bus driving device includes high-side output drivers coupled to a first supply bus and low-side output drivers coupled to a second supply bus. The high-side output drivers and the low-side output drivers are alternately coupled in series. As a result, the bus driving device can drive the first supply bus and the second supply bus at a constant slew rate to make a low common-mode noise.

Figure 3:
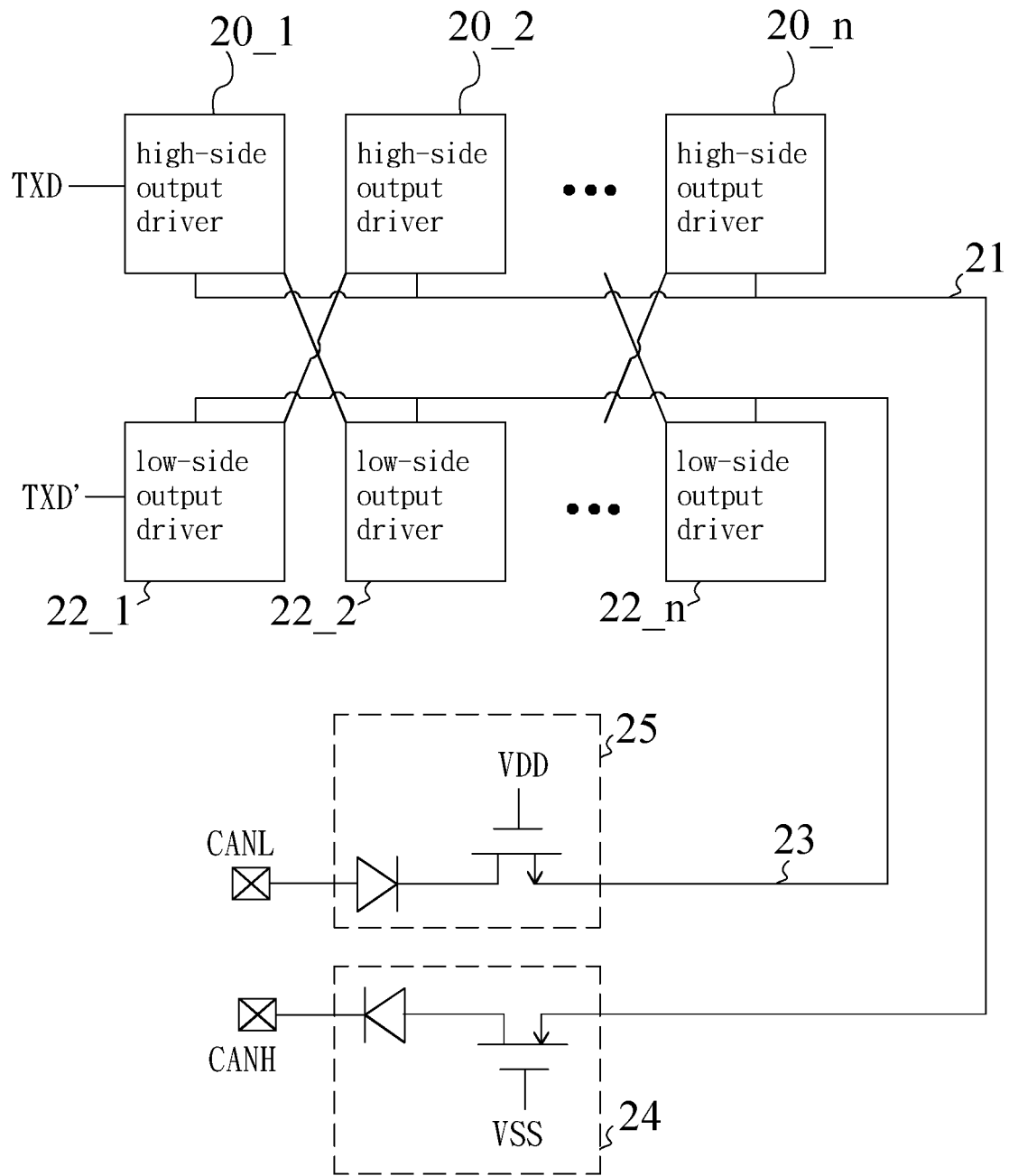
FIG. 3 is a diagram schematically illustrating a bus driving device according to an embodiment of the present invention.

FIG. 3 is a diagram schematically illustrating a bus driving device according to an embodiment of the present invention. Referring to FIG. 3, the bus driving device 2 includes a plurality of high-side output drivers 20_1~20_$n$ coupled to a first supply bus 21 and a plurality of low-side output drivers 22_1~22_$n$ coupled to a second supply bus 23. The number of the high-side output drivers 20_1~20_$n$ is at least three. The number of the low-side output drivers 22_1~22_$n$ is at least three. Besides, the number of the high-side output drivers 20_1~2_$n$ is 3×N. The number of the low-side output drivers 22_1~22_$n$ is 3×M. N and M are positive integers. A part of the high-side output drivers 20_1~20_$n$ and a part of the low-side output drivers 22_1~22_$n$ are alternately coupled in series, and the remains of the high-side output drivers 20_1~20_$n$ and the low-side output drivers 22_1~22_$n$ are alternately coupled in series. The number of the part of the high-side output drivers 20_1~20_$n$ and the part of the low-side output drivers 22_1~22_$n$ is equal to the number of the remains of the high-side output drivers 20_1~20_$n$ and the low-side output drivers 22_1~22_$n$.

The part of the high-side output drivers 20_1~20_$n$ and the part of the low-side output drivers 22_1~22_$n$ receive an input digital signal TXD and sequentially drive the first supply bus 21 and the second supply bus 23 based on the input digital signal TXD, and the remains of the high-side output drivers 20_1~20_$n$ and the low-side output drivers 22_1~22_$n$ receive the inverted input digital signal TXD' and sequentially drive the first supply bus 21 and the second supply bus 23 based on the inverted input digital signal TXD'. When the input digital signal TXD is a high-level voltage, the bus driving device 2 operates in a recessive (Rec) state. When the input digital signal TXD is a low-level voltage, the bus driving device 2 operates in a dominant (Dom) state.

Assume that the bus driving device 2 includes high-side output drivers 20_1~20_4 and low-side output drivers 22_1~22_4. The high-side output driver 20_1, the low-side output driver 22_2, the high-side output driver 20_3, and the low-side output driver 22_4 are connected in series. The low-side output driver 22_1, the high-side output driver 20_2, the low-side output driver 22_3, and the high-side output driver 20_4 are connected in series. The high-side output driver 20_1, the low-side output driver 22_2, the high-side output driver 20_3, and the low-side output driver 22_4 receive an input digital signal TXD and sequentially drive the first supply bus 21 and the second supply bus 23 based on the input digital signal TXD. The low-side output driver 22_1, the high-side output driver 20_2, the low-side output driver 22_3, and the high-side output driver 20_4 receive the inverted input digital signal TXD' and sequentially drive the first supply bus 21 and the second supply bus 23 based on the inverted input digital signal TXD'.

The bus driving device 2 may further include a first high-voltage protection circuit 24 and a second high-voltage protection circuit 25. The first high-voltage protection circuit 24 is coupled between the first supply bus 21 and a first output CANH. The first high-voltage protection circuit 24 prevents an ultra-negative voltage at the first supply bus 21 from passing to the first output CANH. The second high-voltage protection circuit 25 is coupled between the second supply bus 23 and a second output CANL. The second high-voltage protection circuit 25 prevents an ultra-positive voltage at the second supply bus 23 from passing to the second output CANL. In some embodiment of the present invention, the first high-voltage protection circuit 24 may include a P-channel metal oxide semiconductor field effect transistor (PMOSFET) and a diode connected in series. The second high-voltage protection circuit 25 may include an N-channel metal oxide semiconductor field effect transistor (NMOSFET) and a diode connected in series.

Figure 4:
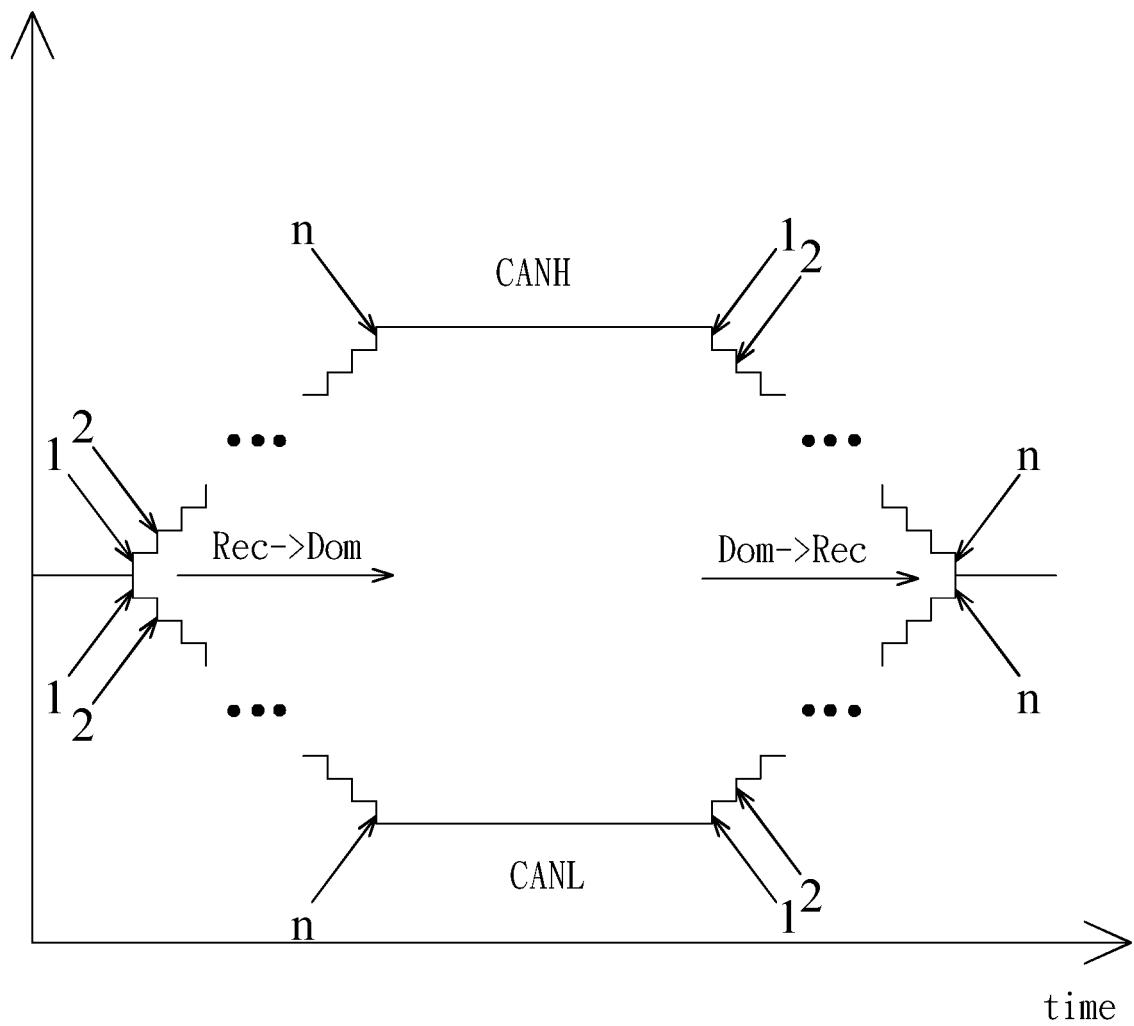
FIG. 4 is a diagram schematically illustrating the waveforms of a first output voltage and a second output voltage according to an embodiment of the present invention.

FIG. 4 is a diagram schematically illustrating the waveforms of a first output voltage at the first output and a second output voltage at the second output according to an embodiment of the present invention. As illustrated in FIG. 3 and FIG. 4, the first output voltage at the first output CANH increases or decreases step by step. Similarly, the second output voltage at the first output CANL increases or decreases step by step. The first output voltage at the first output CANH increases when the high-side output driver 20_1 is triggered on and the bus driving device 2 changes from the recessive state to the dominant state. The first output voltage at the first output CANH further increases when the high-side output drivers 20_1 and 20_2 are triggered on and the bus driving device 2 changes from the recessive state to the dominant state. The first output voltage at the first output CANH reaches to the maximum value when the high-side output drivers 20_1~20_$n$ are triggered on and the bus driving device 2 changes from the recessive state to the dominant state. The first output voltage at the first output CANH decreases when the high-side output driver 20_1 is triggered off and the bus driving device 2 changes from the dominant state to the recessive state. The first output voltage at the first output CANH further decreases when the high-side output drivers 20_1 and 20_2 are triggered off and the bus driving device 2 changes from the dominant state to the recessive state. The first output voltage at the first output CANH reaches to the minimum value when the high-side output drivers 20_1~20_$n$ are triggered off and the bus driving device 2 changes from the dominant state to the recessive state. The second output voltage at the second output CANL decreases when the low-side output driver 22_1 is triggered on and the bus driving device 2 changes from the recessive state to the dominant state. The second output voltage at the second output CANL further decreases when the low-side output drivers 22_1 and 22_2 are triggered on and the bus driving device 2 changes from the recessive state to the dominant state. The second output voltage at the second output CANL reaches to the minimum value when the low-side output drivers 22_1~22_$n$ are triggered on and the bus driving device 2 changes from the recessive state to the dominant state. The second output voltage at the second output CANL increases when the low-side output driver 22_1 is triggered off and the bus driving device 2 changes from the dominant state to the recessive state. The second output voltage at the second output CANL further increases when the low-side output drivers 22_1 and 22_2 are triggered off and the bus driving device 2 changes from the dominant state to the recessive state. The second output voltage at the second output CANL reaches to the maximum value when the low-side output drivers 22_1~22_$n$ are triggered off and the bus driving device 2 changes from the dominant state to the recessive state.

Figure 5:
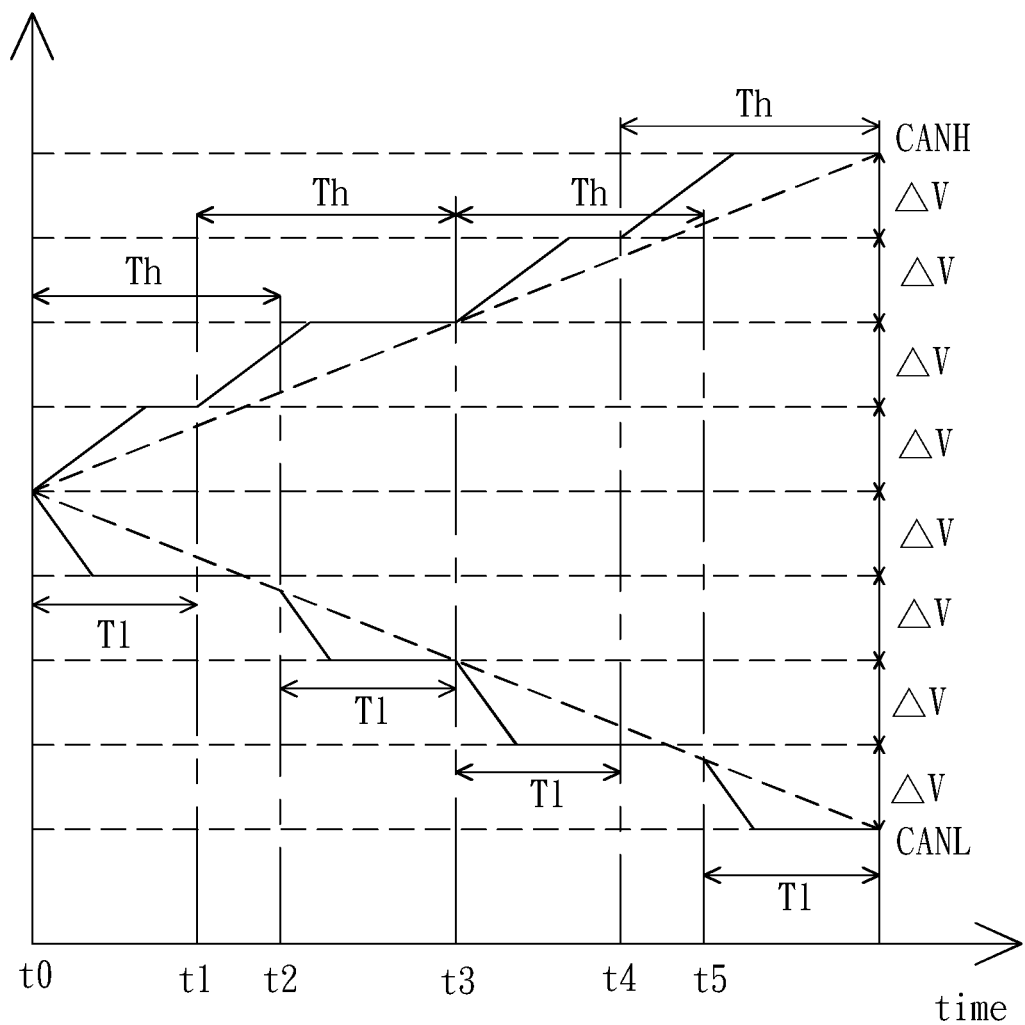
FIG. 5 is a diagram schematically illustrating the waveforms of a first output voltage and a second output voltage when a bus driving device changes from a recessive state to a dominate state according to an embodiment of the present invention.

FIG. 5 is a diagram schematically illustrating the waveforms of a first output voltage and a second output voltage when a bus driving device changes from a recessive state to a dominate state according to an embodiment of the present invention. As illustrated in FIG. 3 and FIG. 5, the high-side output driver 20_1, the low-side output driver 22_2, the high-side output driver 20_3, and the low-side output driver 22_4 receive an input digital signal TXD and sequentially drive the first supply bus 21 and the second supply bus 23 based on the input digital signal TXD. The low-side output driver 22_1, the high-side output driver 20_2, the low-side output driver 22_3, and the high-side output driver 20_4 receive the inverted input digital signal TXD' and sequentially drive the first supply bus 21 and the second supply bus 23 based on the inverted input digital signal TXD'. The high-side output driver 20_1 and the low-side output driver 22_1 are respectively triggered on by the input digital signal TXD and the inverted input digital signal TXD' at time point t0, such that the high-side output driver 20_1 and the low-side output driver 22_1 are respectively drive the first supply bus 21 and the second supply bus 23. Assume that the speed of each of the high-side output drivers 20_1~20_$n$ is slower than that of each of the low-side output drivers 22_1~22_$n$ due to process variations. Th represents a time period when each of the high-side output drivers 20_1~20_$n$ is settled. Tl represents a time period when each of the low-side output drivers 22_1~22_$n$ is settled. Tl is less than Th. After time point t0 plus Tl, the low-side output driver 22_1 triggers on the high-side output driver 20_2 to drive the first supply bus 21 at time point t1. After time point t0 plus Th, the high-side output driver 20_1 triggers on the low-side output driver 22_2 to drive the second supply bus 23 at time point t2. Tl plus Th equals to synchronization time. $\Delta V = Vd/(2 \times Num)$, wherein Vd represents a voltage difference between the maximum value of the first output voltage at the first output CANH and the minimum value of the second output voltage at the second output CANL, and Num represents the total number of the high-side output drivers 20_1~20_$n$ and the low-side output drivers 22_1~22_$n$. The increased slope of the first output voltage at the first output CANH equals to the absolute value of the decreased slope of the second output voltage at the second output CANL. The increased slope of the first output voltage at the first output CANH equals to $2 \times \Delta V/(Tl+Th)$. After time point t2 plus Tl, the low-side output driver 22_2 triggers on the high-side output driver 20_3 to drive the first supply bus 21 at time point t3. After time point t1 plus Th, the high-side output driver 20_2 triggers on the low-side output driver 22_3 to drive the second supply bus 23 at time point t3. In other words, the third high-side output driver 20_3 and the third low-side output driver 22_3 are simultaneously triggered on, such that the voltages at the first output CANH and the second output CANL remain a constant slew rate and make a low common-mode noise. By the same token, every three high-side output drivers and every three low-side output drivers can perfectly generate symmetric bus signals at a high data rate, such as 5 Mbps. After time point t3 plus Tl, the low-side output driver 22_3 triggers on the high-side output driver 20_4 to drive the first supply bus 21 at time point t4. After time point t3 plus Th, the high-side output driver 20_3 triggers on the low-side output driver 22_4 to drive the second supply bus 23 at time point t5.

Figure 6:
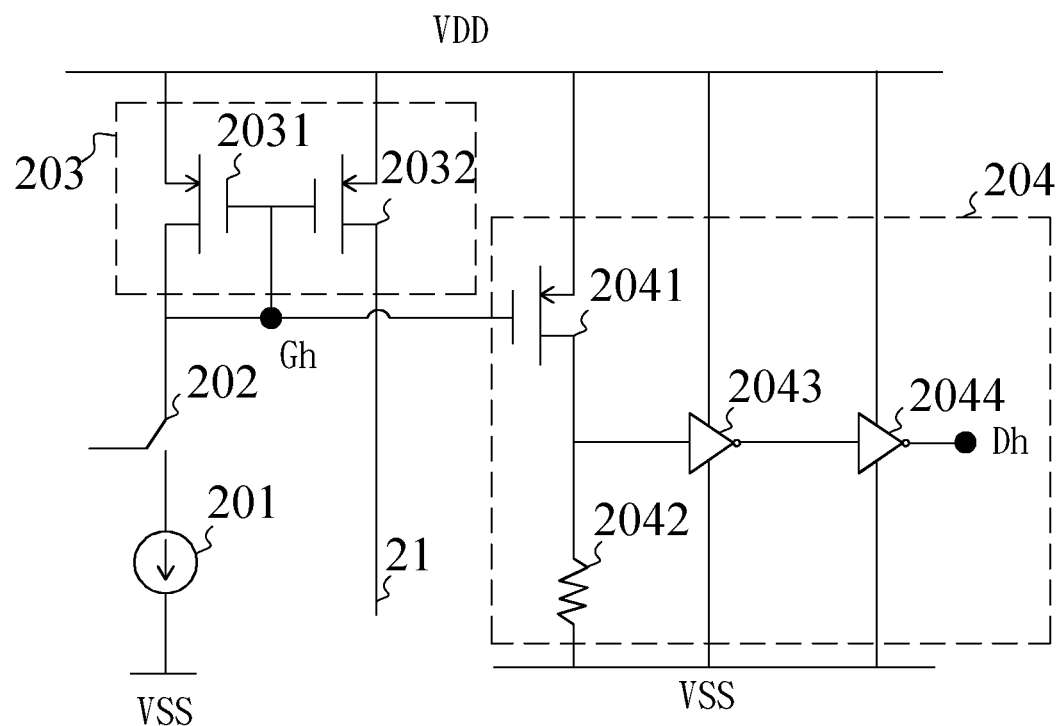
FIG. 6 is a diagram schematically illustrating a high-side output driver according to an embodiment of the present invention.

FIG. 6 is a diagram schematically illustrating a high-side output driver according to an embodiment of the present invention. Referring to FIG. 6 and FIG. 3, each high-side output driver 20 of the high-side output drivers 20_1~20_$n$ may include a first current source 201, a first electrical switch 202, a first current mirror 203, and a first current sensing circuit 204. The first current source 201 is coupled to a low-voltage terminal with voltage VSS. The first electrical switch 202 is coupled to the first current source 201. The first current mirror 203 is coupled to the first supply bus 21, a high-voltage terminal with voltage VDD and the first electrical switch 202. The first current sensing circuit 204 is coupled to the first control terminal Gh of the first current mirror 203, the high-voltage terminal, the low-voltage terminal, and one of the low-side output drivers 22_1~22_n.

The first current source 201 generates a first constant current. The first electrical switch 202 is configured to receive the input digital signal TXD or coupled to one of the low-side output drivers 22_1~22_n. The input digital signal TXD or one of the low-side output drivers 22_1~22_n turns on or turns off the first electrical switch 202. The first current mirror 203 drives the first supply bus 21 based on the first constant current when the first electrical switch 202 is turned on. The first current mirror 203 stops driving the first supply bus 21 when the first electrical switch 202 is turned off. The first current sensing circuit 204 triggers on one of the low-side output drivers 22_1~22_n when the first electrical switch 202 is turned on. The first current sensing circuit 204 triggers off one of the low-side output drivers 22_1~22_n when the first electrical switch 202 is turned off.

In some embodiments of the present invention, the first current mirror 203 may include a first P-channel metal oxide semiconductor field effect transistor (PMOSFET) 2031 and a second P-channel metal oxide semiconductor field effect transistor (PMOSFET) 2032. The source of the first PMOSFET 2031 is coupled to the high-voltage terminal The drain of the first PMOSFET 2031 is coupled to the first electrical switch 202. The source of the second PMOSFET 2032 is coupled to the high-voltage terminal The gate of the second PMOSFET 2032 is coupled to the first current sensing circuit 204, and the gate and the drain of the first PMOSFET 2031. The drain of the second PMOSFET 2032 is coupled to the first supply bus 21. The gate of the first PMOSFET 2031 is used as the first control terminal Gh. The first PMOSFET 2031 and the second PMOSFET 2032 drive the first supply bus 21 based on the first constant current when the first electrical switch 202 is turned on. The first PMOSFET 2031 and the second PMOSFET 2032 stop driving the first supply bus 21 when the first electrical switch 202 is turned off.

In some embodiments of the present invention, the first current sensing circuit 204 may include a third P-channel metal oxide semiconductor field effect transistor (PMOSFET) 2041, a first resistor 2042, a first inverter 2043, and a second inverter 2044. The gate of the third PMOSFET 2041 is coupled to the first control terminal Gh. The source of the third PMOSFET 2041 is coupled to the high-voltage terminal The drain of the third PMOSFET 2041 is coupled to the low-voltage terminal through the first resistor 2042. The first inverter 2043 is coupled to the high-voltage terminal, the low-voltage terminal, the first resistor 2042, and the drain of the third PMOSFET 2041. The second inverter 2044 is coupled to the high-voltage terminal, the low-voltage terminal, the first inverter 2043, and one of the low-side output drivers 22_1~22_n. The third PMOSFET 2041, the first resistor 2042, the first inverter 2043, and the second inverter 2044 trigger on one of the low-side output drivers 22_1~22_n when the first electrical switch 202 is turned on. The third PMOSFET 2041, the first resistor 2042, the first inverter 2043, and the second inverter 2044 trigger off one of the low-side output drivers 22_1~22_n when the first electrical switch 202 is turned off.

Figure 7:
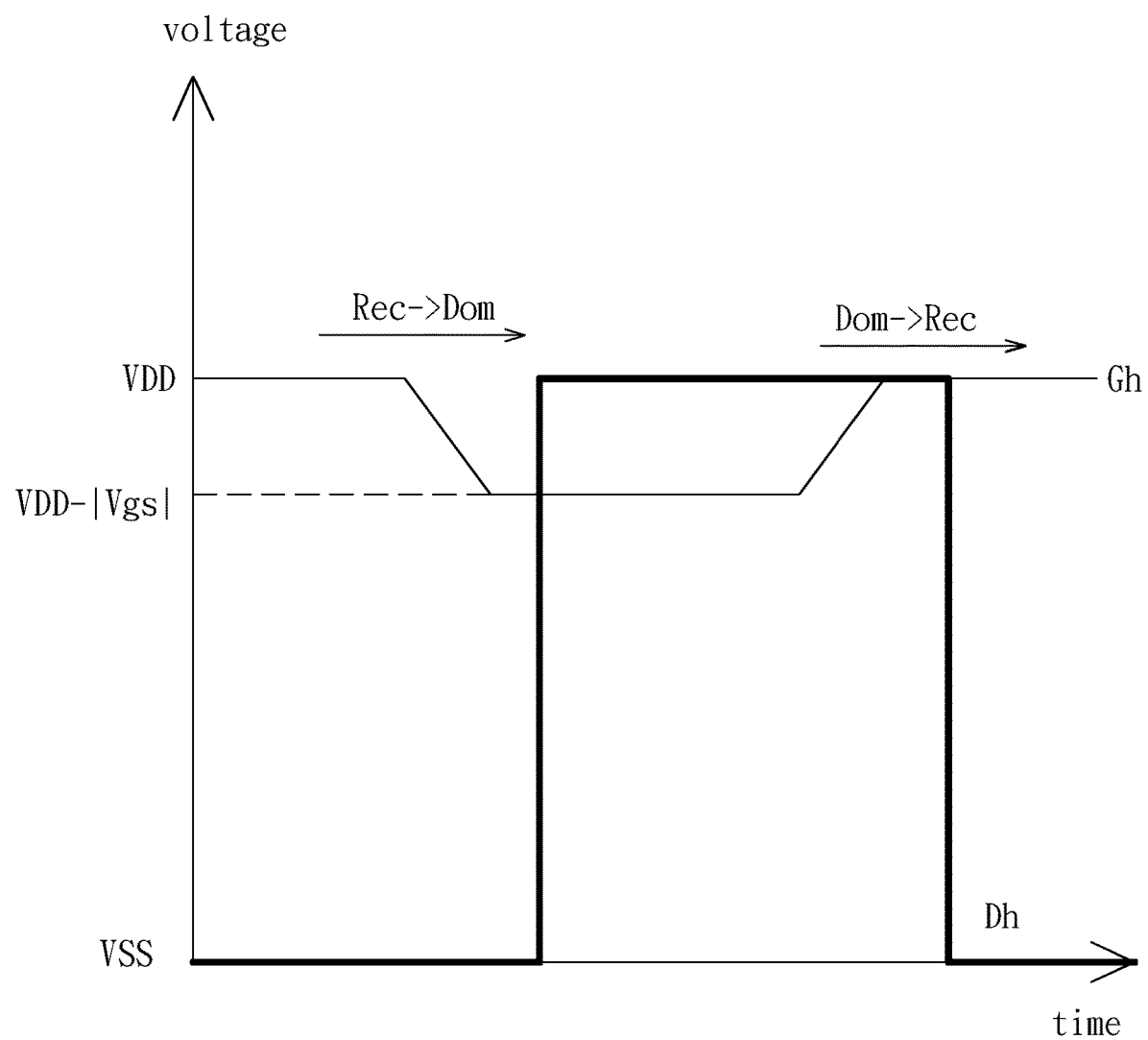
FIG. 7 is a diagram schematically illustrating the waveforms of a gate voltage and a trigger voltage of a high-side output driver according to an embodiment of the present invention.

FIG. 7 is a diagram schematically illustrating the waveforms of a gate voltage and a trigger voltage of a high-side output driver according to an embodiment of the present invention. Referring to FIG. 6 and FIG. 7, the output Dh of the second inverter 2044, coupled to one of the low-side output drivers 22_1~22_n, generates a trigger voltage to trigger on or trigger off one of the low-side output drivers 22_1~22_n. From the recessive state to the dominant state, the first electrical switch 202 changes from off state to on state and the voltage of the gate Gh decreases from VDD to (VDD−|Vgs|). |Vgs| represents the absolute value of gate-source voltage of the first PMOSFET 2031. Thus, the trigger voltage at the output Dh changes from VSS to VDD to trigger on one of the low-side output drivers 22_1~22_n. From the dominant state to the recessive state, the first electrical switch 202 changes from on state to off state and the voltage of the gate Gh increases from (VDD−|Vgs|) to VDD. Thus, the trigger voltage at the output Dh changes from VDD to VSS to trigger off one of the low-side output drivers 22_1~22_n. The speed of the first current mirror 203 depends on the first constant current and the parasitic capacitance. The third PMOSFET 2041 reflects the speed of the first current mirror 203. If the voltage of the gate Gh is settled to its steady state fast, the voltage of the output Dh changes its state fast.

Figure 8:
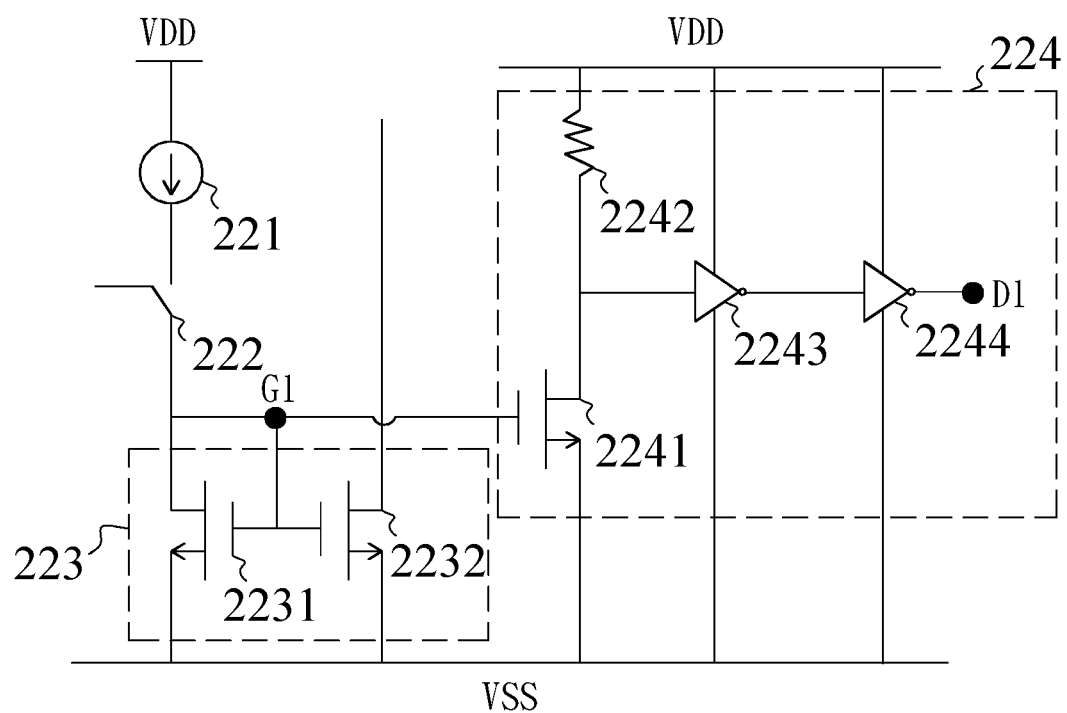
FIG. 8 is a diagram schematically illustrating a low-side output driver according to an embodiment of the present invention.

FIG. 8 is a diagram schematically illustrating a low-side output driver according to an embodiment of the present invention. Referring to FIG. 8, FIG. 6, and FIG. 3, each low-side output driver 22 of the low-side output drivers 22_1~22_n may include a second current source 221, a second electrical switch 222, a second current mirror 223, and a second current sensing circuit 224. The second current source 221 is coupled to the high-voltage terminal. The second electrical switch 222 is coupled to the second current source 221. The second electrical switch 222 may be coupled to the output Dh. The second current mirror 223 is coupled to the second supply bus 23, the low-voltage terminal, and the second electrical switch 222. The second current sensing circuit 224 is coupled to the second control terminal Gl of the second current mirror 223, the high-voltage terminal, the low-voltage terminal, and one of the high-side output drivers 20_1~20_n.

The second current source 221 generates a second constant current. The second electrical switch 222 is configured to receive the inverted input digital signal TXD' or coupled to one of the high-side output drivers 20_1~20_n. The inverted input digital signal TXD' or the voltage of the output Dh of one of the high-side output drivers 20_1~20_n turns on or turns off the second electrical switch 222. The second current mirror 223 drives the second supply bus 23 based on the second constant current when the second electrical switch 222 is turned on. The second current mirror 223 stops driving the second supply bus 23 when the second electrical switch 222 is turned off. The second current sensing circuit 224 triggers on one of the high-side output drivers 20_1~20_n when the second electrical switch 222 is turned on. The second current sensing circuit 224 triggers off one of the high-side output drivers 20_1~20_n when the second electrical switch 222 is turned off.

In some embodiments of the present invention, the second current mirror 223 may include a first N-channel metal oxide semiconductor field effect transistor (NMOSFET) 2231 and a second N-channel metal oxide semiconductor field effect transistor (NMOSFET) 2232. The source of the first NMOSFET 2231 is coupled to the low-voltage terminal The drain of the first NMOSFET 2231 is coupled to the second electrical switch 222. The source of the second NMOSFET 2232 is coupled to the low-voltage terminal The gate of the second NMOSFET 2232 is coupled to the second current sensing circuit 224, and the gate and the drain of the first NMOSFET 2231. The drain of the second NMOSFET 2232 is coupled to the second supply bus 23. The gate of the first NMOSFET 2231 is used as the second control terminal Gl. The first NMOSFET 2231 and the second NMOSFET 2232 drive the second supply bus 23 based on the second constant current when the second electrical switch 222 is turned on. The first NMOSFET 2231 and the second NMOSFET 2232 stop driving the second supply bus 23 when the second electrical switch 222 is turned off.

In some embodiments of the present invention, the second current sensing circuit 224 may include a third N-channel metal oxide semiconductor field effect transistor (NMOSFET) 2241, a second resistor 2242, a third inverter 2243, and a fourth inverter 2244. The gate of the third NMOSFET 2241 is coupled to the second control terminal Gl. The source of the third NMOSFET 2241 is coupled to the low-voltage terminal The drain of the third NMOSFET 2241 is coupled to the high-voltage terminal through the second resistor 2242. The third inverter 2243 is coupled to the high-voltage terminal, the low-voltage terminal, the second resistor 2242, and the drain of the third NMOSFET 2241. The fourth inverter 2244 is coupled to the high-voltage terminal, the low-voltage terminal, the third inverter 2243, and one of the high-side output drivers 20_1~20_n. The third NMOSFET 2241, the second resistor 2242, the third inverter 2243, and the fourth inverter 2244 trigger on one of the high-side output drivers 20_1~20_n when the second electrical switch 222 is turned on. The third NMOSFET 2241, the second resistor 2242, the third inverter 2243, and the fourth inverter 2244 trigger off one of the high-side output drivers 20_1~20_n when the second electrical switch 222 is turned off.

Figure 9:
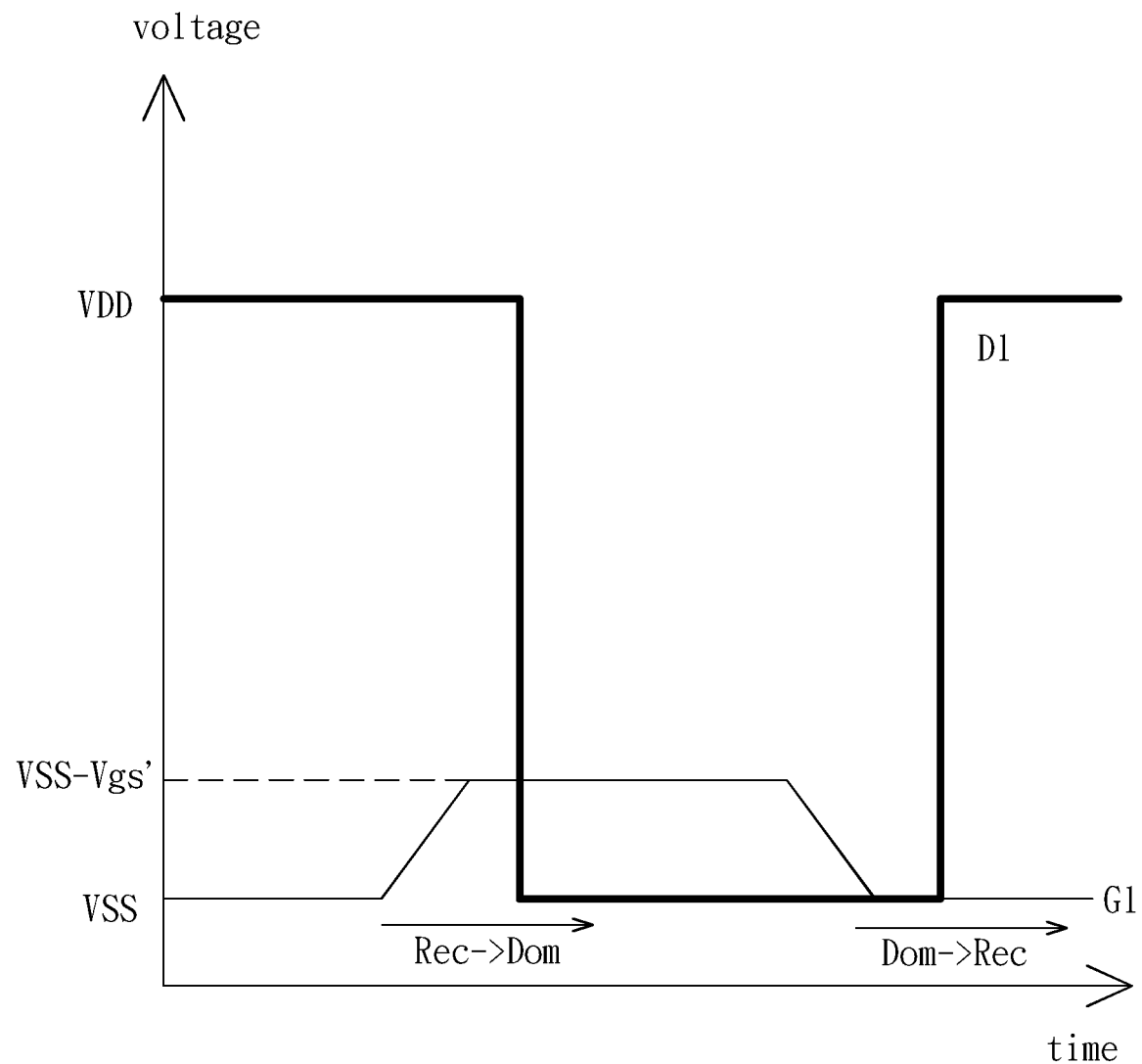
FIG. 9 is a diagram schematically illustrating the waveforms of a gate voltage and a trigger voltage of a low-side output driver according to an embodiment of the present invention.

FIG. 9 is a diagram schematically illustrating the waveforms of a gate voltage and a trigger voltage of a low-side output driver according to an embodiment of the present invention. Referring to FIG. 6, FIG. 8, and FIG. 9, the output Dl of the fourth inverter 2244, coupled to the first electrical switch 202 of one of the high-side output drivers 201~20_n, generates a trigger voltage to turn on or turn off one of the first electrical switch 202. From the recessive state to the dominant state, the second electrical switch 222 changes from off state to on state and the voltage of the gate Gl increases from VSS to (VSS+Vgs'). Vgs' represents the gate-source voltage of the first NMOSFET 2231. Thus, the trigger voltage at the output Dl changes from VDD to VSS to trigger on one of the high-side output drivers 20_1~20_n. From the dominant state to the recessive state, the second electrical switch 222 changes from on state to off state and the voltage of the gate Gl decreases from (VSS+Vgs') to VSS. Thus, the trigger voltage at the output Dl changes from VSS to VDD to trigger off one of the high-side output drivers 20_1~20_n. The speed of the second current mirror 223 depends on the second constant current and the parasitic capacitance. The third NMOSFET 2241 reflects the speed of the second current mirror 223. If the voltage of the gate Gl is settled to its steady state fast, the voltage of the output Dl changes its state fast.

According to the embodiments provided above, the bus driving device includes high-side output drivers coupled to a first supply bus and low-side output drivers coupled to a second supply bus. The high-side output drivers and the low-side output drivers are alternately coupled in series. As a result, the bus driving device can drive the first supply bus and the second supply bus at a constant slew rate to make a low common-mode noise.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A bus driving device comprising:
at least three high-side output drivers coupled to a first supply bus; and
at least three low-side output drivers coupled to a second supply bus, wherein a part of the at least three high-side output drivers and a part of the at least three low-side output drivers are alternately coupled in series, remains of the at least three high-side output drivers and the at least three low-side output drivers are alternately coupled in series, number of the part of the at least three high-side output drivers and the part of the at least three low-side output drivers is equal to number of the remains of the at least three high-side output drivers and the at least three low-side output drivers, the part of the at least three high-side output drivers and the part of the at least three low-side output drivers are configured to receive an input digital signal and sequentially drive the first supply bus and the second supply bus based on the input digital signal, and the remains of the at least three high-side output drivers and the at least three low-side output drivers are configured to receive an inverted the input digital signal and sequentially drive the first supply bus and the second supply bus based on the inverted the input digital signal.

2. The bus driving device of claim 1, wherein each of the at least three high-side output drivers comprises:
a first current source coupled to a low-voltage terminal and configured to generate a first constant current;
a first electrical switch coupled to the first current source, wherein the first electrical switch is configured to receive the input digital signal or coupled to one of the at least three low-side output drivers, and the input digital signal or one of the at least three low-side output drivers is configured to turn on or turn off the first electrical switch;
a first current mirror coupled to the first supply bus, a high-voltage terminal and the first electrical switch, wherein the first current mirror drives the first supply bus based on the first constant current when the first electrical switch is turned on, and the first current mirror stops driving the first supply bus when the first electrical switch is turned off; and
a first current sensing circuit coupled to a first control terminal of the first current mirror, the high-voltage terminal, the low-voltage terminal, and one of the at least three low-side output drivers, wherein the first current sensing circuit triggers on one of the at least three low-side output drivers when the first electrical switch is turned on, and the first current sensing circuit triggers off one of the at least three low-side output drivers when the first electrical switch is turned off.

3. The bus driving device of claim 2, wherein the first current mirror comprises:
a first P-channel metal oxide semiconductor field effect transistor (PMOSFET) with a source thereof coupled to the high-voltage terminal and a drain thereof coupled to the first electrical switch; and a second P-channel metal oxide semiconductor field effect transistor (PMOSFET) with a source thereof coupled to the high-voltage terminal, a gate thereof coupled to the first current sensing circuit, and a gate and the drain of the first PMOSFET, and a drain thereof coupled to the first supply bus, wherein the gate of the first PMOSFET is used as the first control terminal, the first PMOSFET and the second PMOSFET drive the first supply bus based on the first constant current when the first electrical switch is turned on, and the first PMOSFET and the second PMOSFET stop driving the first supply bus when the first electrical switch is turned off.

4. The bus driving device of claim 3, wherein the first current sensing circuit comprises:
a third P-channel metal oxide semiconductor field effect transistor (PMOSFET) with a gate thereof coupled to the first control terminal, a source thereof coupled to the high-voltage terminal, and a drain thereof coupled to the low-voltage terminal through a first resistor;
a first inverter coupled to the high-voltage terminal, the low-voltage terminal, the first resistor, and the drain of the third PMOSFET; and
a second inverter coupled to the high-voltage terminal, the low-voltage terminal, the first inverter, and one of the at least three low-side output drivers, wherein the third PMOSFET, the first resistor, the first inverter, and the second inverter trigger on one of the at least three low-side output drivers when the first electrical switch is turned on, and the third PMOSFET, the first resistor, the first inverter, and the second inverter trigger off one of the at least three low-side output drivers when the first electrical switch is turned off.

5. The bus driving device of claim 1, wherein each of the at least three low-side output drivers comprises:
a second current source coupled to the high-voltage terminal and configured to generate a second constant current;
a second electrical switch coupled to the second current source, wherein the second electrical switch is configured to receive the inverted the input digital signal or coupled to one of the at least three high-side output drivers, and the inverted the input digital signal or one of the at least three high-side output drivers is configured to turn on or turn off the second electrical switch;
a second current mirror coupled to the second supply bus, the low-voltage terminal, and the second electrical switch, wherein the second current mirror drives the second supply bus based on the second constant current when the second electrical switch is turned on, and the second current mirror stops driving the second supply bus when the second electrical switch is turned off; and
a second current sensing circuit coupled to a second control terminal of the second current mirror, the high-voltage terminal, the low-voltage terminal, and one of the at least three high-side output drivers, wherein the second current sensing circuit triggers on one of the at least three high-side output drivers when the second electrical switch is turned on, and the second current sensing circuit triggers off one of the at least three high-side output drivers when the second electrical switch is turned off.

6. The bus driving device of claim 5, wherein the second current mirror comprises:
a first N-channel metal oxide semiconductor field effect transistor (NMOSFET) with a source thereof coupled to the low-voltage terminal and a drain thereof coupled to the second electrical switch; and
a second N-channel metal oxide semiconductor field effect transistor (NMOSFET) with a source thereof coupled to the low-voltage terminal, a gate thereof coupled to the second current sensing circuit, and a gate and the drain of the first NMOSFET, and a drain thereof coupled to the second supply bus, wherein the gate of the first NMOSFET is used as the second control terminal, the first NMOSFET and the second NMOSFET drive the second supply bus based on the second constant current when the second electrical switch is turned on, and the first NMOSFET and the second NMOSFET stop driving the second supply bus when the second electrical switch is turned off.

7. The bus driving device of claim 6, wherein the second current sensing circuit comprises:
a third N-channel metal oxide semiconductor field effect transistor (NMOSFET) with a gate thereof coupled to the second control terminal, a source thereof coupled to the low-voltage terminal, and a drain thereof coupled to the high-voltage terminal through a second resistor;
a third inverter coupled to the high-voltage terminal, the low-voltage terminal, the second resistor, and the drain of the third NMOSFET; and
a fourth inverter coupled to the high-voltage terminal, the low-voltage terminal, the third inverter, and one of the at least three high-side output drivers, wherein the third NMOSFET, the second resistor, the third inverter, and the fourth inverter trigger on one of the at least three high-side output drivers when the second electrical switch is turned on, and the third NMOSFET, the second resistor, the third inverter, and the fourth inverter trigger off one of the at least three high-side output drivers when the second electrical switch is turned off.

8. The bus driving device of claim 1, further comprising:
a first high-voltage protection circuit coupled between the first supply bus and a first output and configured to prevent an ultra-negative voltage at the first supply bus from passing to the first output; and
a second high-voltage protection circuit coupled between the second supply bus and a second output and configured to prevent an ultra-positive voltage at the second supply bus from passing to the second output.

9. The bus driving device of claim 8, wherein the first high-voltage protection circuit comprises a P-channel metal oxide semiconductor field effect transistor (PMOSFET) and a diode connected in series, and the second high-voltage protection circuit comprises an N-channel metal oxide semiconductor field effect transistor (NMOSFET) and a diode connected in series.

10. The bus driving device of claim 1, wherein number of the at least three high-side output drivers is 3×N, number of the at least three low-side output drivers is 3×M, and N and M are positive integers.

* * * * *